United States Patent
Paneccasio, Jr. et al.

(10) Patent No.: US 7,815,786 B2
(45) Date of Patent: Oct. 19, 2010

(54) COPPER ELECTRODEPOSITION IN MICROELECTRONICS

(75) Inventors: Vincent Paneccasio, Jr., Madison, CT (US); Xuan Lin, Northford, CT (US); Paul Figura, Orange, CT (US); Richard Hurtubise, Clinton, CT (US)

(73) Assignee: Enthone Inc., New Haven, CT (US)

( * ) Notice: Subject to any disclaimer, the term of this patent is extended or adjusted under 35 U.S.C. 154(b) by 468 days.

(21) Appl. No.: 11/846,385

(22) Filed: Aug. 28, 2007

(65) Prior Publication Data
US 2007/0289875 A1    Dec. 20, 2007

Related U.S. Application Data

(62) Division of application No. 11/272,999, filed on Nov. 14, 2005, now Pat. No. 7,303,992.

(60) Provisional application No. 60/627,700, filed on Nov. 12, 2004.

(51) Int. Cl.
H01L 21/4763 (2006.01)

(52) U.S. Cl. ............... 205/296; 205/291; 257/E21.175; 257/E21.585

(58) Field of Classification Search .................. 438/637; 205/291, 261
See application file for complete search history.

(56) References Cited

U.S. PATENT DOCUMENTS

| | | | |
|---|---|---|---|
| 3,832,291 A | 8/1974 | Arcilesi | |
| 4,336,114 A | 6/1982 | Mayer et al. | |
| 4,347,108 A | 8/1982 | Willis | |
| 4,374,709 A | 2/1983 | Combs | |
| 4,376,685 A | 3/1983 | Watson | |
| 4,512,856 A | 4/1985 | Paneccasio | |
| 4,898,652 A | 2/1990 | Bammel et al. | |
| 5,174,887 A | 12/1992 | Federman et al. | |
| 5,328,589 A | 7/1994 | Martin | |
| 5,433,840 A | 7/1995 | Dahms et al. | |
| 6,024,856 A | 2/2000 | Haydu et al. | |
| 6,113,771 A | 9/2000 | Landau et al. | |
| 6,129,830 A | 10/2000 | Senge et al. | |
| 6,338,411 B1 | 1/2002 | Katabe | |
| 6,350,366 B1 | 2/2002 | Landau et al. | |
| 6,379,522 B1 | 4/2002 | Landau et al. | |

(Continued)

FOREIGN PATENT DOCUMENTS

DE        2610705        9/1977

OTHER PUBLICATIONS

Abstract of DE2610705; Sep. 22, 1977.

(Continued)

*Primary Examiner*—Alexander G Ghyka
(74) *Attorney, Agent, or Firm*—Senniger Powers LLP

(57) ABSTRACT

An electrolytic plating method and composition for electrolytically plating Cu onto a semiconductor integrated circuit substrate having submicron-sized interconnect features. The composition comprises a source of Cu ions and a suppressor compound comprising polyether groups. The method involves superfilling by rapid bottom-up deposition at a superfill speed by which Cu deposition in a vertical direction from the bottoms of the features to the top openings of the features is substantially greater than Cu deposition on the side walls.

19 Claims, 3 Drawing Sheets

U.S. PATENT DOCUMENTS

| | | |
|---|---|---|
| 6,444,110 B2 | 9/2002 | Barstad et al. |
| 6,518,182 B1 | 2/2003 | Ishikawa et al. |
| 6,544,399 B1 | 4/2003 | Landau et al. |
| 6,551,487 B1 | 4/2003 | Reid et al. |
| 6,596,151 B2 | 7/2003 | Landau et al. |
| 6,607,654 B2 | 8/2003 | Lee et al. |
| 6,610,191 B2 | 8/2003 | Landau et al. |
| 6,660,153 B2 | 12/2003 | Merricks et al. |
| 6,706,418 B2 | 3/2004 | Egli et al. |
| 6,740,221 B2 | 5/2004 | Cheung et al. |
| 6,776,893 B1 | 8/2004 | Too et al. |
| 6,797,142 B2 | 9/2004 | Crosby |
| 6,800,188 B2 | 10/2004 | Hagiwara et al. |
| 6,881,319 B2 | 4/2005 | Seita et al. |
| 6,926,922 B2 | 8/2005 | Leung et al. |
| 7,105,082 B2 | 9/2006 | Hardikar |
| 7,182,849 B2 | 2/2007 | Shih et al. |
| 2002/0112964 A1 | 8/2002 | Gandikota et al. |
| 2003/0168343 A1 | 9/2003 | Commander et al. |
| 2004/0138075 A1 | 7/2004 | Brown et al. |
| 2004/0154926 A1 | 8/2004 | Sun et al. |
| 2004/0217009 A1 | 11/2004 | Mikkola et al. |
| 2004/0222104 A1 | 11/2004 | Wang et al. |
| 2005/0045485 A1 | 3/2005 | Shih et al. |
| 2005/0045488 A1* | 3/2005 | Paneccasio et al. ......... 205/291 |
| 2005/0081744 A1 | 4/2005 | Klocke et al. |
| 2005/0199507 A1 | 9/2005 | Shih et al. |
| 2005/0211564 A1 | 9/2005 | Shih et al. |
| 2005/0241946 A1 | 11/2005 | Nagai et al. |
| 2005/0274622 A1 | 12/2005 | Sun et al. |
| 2006/0118422 A1 | 6/2006 | Ko et al. |

OTHER PUBLICATIONS

International Preliminary Report on Patent Ability, PCT/US2005/040996, dated May 24, 2007, 2 pages.

International Search Report and Written Opinion, PCT/US2005/040996, dated May 10, 2006, 7 pages.

* cited by examiner

COPPER ELECTRODEPOSITION IN MICROELECTRONICS

CROSS REFERENCE TO RELATED APPLICATIONS

This application is a divisional of U.S. patent application Ser. No. 11/272,999, filed on Nov. 14, 2005, entitled COPPER ELECTRODEPOSITION IN MICROELECTRONICS. U.S. patent application Ser. No. 11/272,999 claims the benefit of U.S. Provisional Application No. 60/627,700, filed Nov. 12, 2004, which is incorporated herein by reference in its entirety.

FIELD OF THE INVENTION

This invention relates to a method, compositions, and additives for electrolytic Cu metallization in the field of microelectronics manufacture.

BACKGROUND OF THE INVENTION

Electrolytic Cu metallization is employed in the field of microelectronics manufacture to provide electrical interconnection in a wide variety of applications, such as, for example, in the manufacture of semiconductor integrated circuit (IC) devices. The demand for manufacturing semiconductor IC devices such as computer chips with high circuit speed and high packing density requires the downward scaling of feature sizes in ultra-large-scale integration (ULSI) and very-large-scale integration (VLSI) structures. The trend to smaller device sizes and increased circuit density requires decreasing the dimensions of interconnect features. An interconnect feature is a feature such as a via or trench formed in a dielectric substrate which is then filled with metal to yield an electrically conductive interconnect. Further decreases in interconnect size present challenges in metal filling.

Copper has been introduced to replace aluminum to form the connection lines and interconnects in semiconductor substrates. Copper has a lower resistivity than aluminum and the thickness of a Cu line for the same resistance can be thinner than that of an aluminum line.

The use of copper has introduced a number of requirements into the IC manufacturing process. First, copper has a tendency to diffuse into the semiconductor's junctions, thereby disturbing their electrical characteristics. To combat this occurrence, a barrier layer, such as titanium nitride, tantalum, tantalum nitride, or other layers as are known in the art, is applied to the dielectric prior to the copper layer's deposition. It is also necessary that the copper be deposited on the barrier layer cost-effectively while ensuring the requisite coverage thickness for carrying signals between the IC's devices. As the architecture of ICs continues to shrink, this requirement proves to be increasingly difficult to satisfy.

One conventional semiconductor manufacturing process is the copper damascene system. Specifically, this system begins by etching the circuit architecture into the substrate's dielectric material. The architecture is comprised of a combination of the aforementioned trenches and vias. Next, a barrier layer is laid over the dielectric to prevent diffusion of the subsequently applied copper layer into the substrate's junctions, followed by physical or chemical vapor deposition of a copper seed layer to provide electrical conductivity for a sequential electrochemical process. Copper to fill into the vias and trenches on substrates can be deposited by plating (such as electroless and electrolytic), sputtering, plasma vapor deposition (PVD), and chemical vapor deposition (CVD). It is generally recognized electrochemical deposition is the best method to apply Cu since it is more economical than other deposition methods and can flawlessly fill into the interconnect features (often called "bottom up" growth). After the copper layer has been deposited, excess copper is removed from the facial plane of the dielectric by chemical mechanical polishing, leaving copper in only the etched interconnect features of the dielectric. Subsequent layers are produced similarly before assembly into the final semiconductor package.

Copper plating methods must meet the stringent requirements of the semiconductor industry. For example, Cu deposits must be uniform and capable of flawlessly filling the small interconnect features of the device, for example, with openings of 100 nm or smaller.

Electrolytic Cu systems have been developed which rely on so-called "superfilling" or "bottom-up growth" to deposit Cu into high aspect ratio features. Superfilling involves filling a feature from the bottom up, rather than at an equal rate on all its surfaces, to avoid seams and pinching off that can result in voiding. Systems consisting of a suppressor and an accelerator as additives have been developed for superfilling. As the result of momentum of bottom-up growth, the Cu deposit is thicker on the areas of interconnect features than on the field area that does not have features. These overgrowth regions are commonly called overplating, mounding, bumps, or humps. Smaller features generate higher overplating humps due to faster superfill speed. The overplating poses challenges for later chemical and mechanical polishing processes that planarize the Cu surface. A third organic additive called a "leveler" is typically used to reduce the overgrowth.

As chip architecture gets smaller, with interconnects having openings on the order of 100 nm and smaller through which Cu must grow to fill the interconnects, there is a need for enhanced bottom-up speed. That is, the Cu must fill "faster" in the sense that the rate of growth on the feature bottom must be substantially greater than the rate of growth on the rest of areas, and even more so than in conventional superfilling of larger interconnects.

In addition to superfilling and overplating issues, microdefects may form when electrodepositing Cu for filling interconnect features. One defect that can occur is the formation of internal voids inside the features. As Cu is deposited on the feature side walls and top entry of the feature, deposition on the side walls and entrance to the feature can pinch off and thereby close access to the depths of the feature especially with features which are small (e.g., <100 nm) and/or which have a high aspect ratio (depth:width) if the bottom-up growth rate is not fast enough. Smaller feature size or higher aspect ratio generally requires faster bottom-up speed to avoid pinching off. Moreover, smaller size or higher aspect ratio features tend to have thinner seed coverage on the sidewall and bottom of a via/trench where voids can also be produced due to insufficient copper growth in these areas. An internal void can interfere with electrical connectivity through the feature.

Microvoids are another type of defect which can form during or after electrolytic Cu deposition due to uneven Cu growth or grain recrystallization that happens after Cu plating.

In a different aspect, some local areas of a semiconductor substrate, typically areas where there is a Cu seed layer deposited by physical vapor deposition, may not grow Cu during the electrolytic deposition, resulting in pits or missing metal defects. These Cu voids are considered to be "killer defects," as they reduce the yield of semiconductor manufacturing products. Multiple mechanisms contribute to the formation of these Cu voids, including the semiconductor substrate itself. However, Cu electroplating chemistry has influence on the occurrence and population of these defects.

Other defects are surface protrusions, which are isolated deposition peaks occurring at localized high current density sites, localized impurity sites, or otherwise. Copper plating chemistry has influence on the occurrence of such protrusion defects. Although not considered as defects, Cu surface roughness is also important for semiconductor wafer manufacturing. Generally, a bright Cu surface is desired as it can reduce the swirl patterns formed during wafer entry in the plating solution. Roughness of Cu deposits makes it more difficult to detect defects by inspection, as defects may be concealed by peaks and valleys of rough surface topography. Moreover, smooth growth of Cu is becoming more important for flawlessly filling of fine interconnect structures as the roughness can cause pinch off of feature and thereby close access to the depths of the feature. It is generally recognized that Cu plating chemistry, including suppressor, accelerator, and leveler, has great influence on the roughness of Cu deposits.

SUMMARY OF THE INVENTION

The invention is directed to an electrolytic plating composition for electrolytically plating Cu onto a semiconductor integrated circuit substrate having a planar plating surface and submicron-sized interconnect features by immersion of the semiconductor integrated circuit substrate into the electrolytic solution. The composition comprises a source of Cu ions in an amount sufficient to electrolytically deposit Cu onto the substrate and into the electrical interconnect features and a suppressor compound comprising a combination of propylene oxide (PO) repeat units and ethylene oxide (EO) repeat units present in a PO:EO ratio between about 1:9 and about 9:1 and bonded to a nitrogen-containing species, wherein the molecular weight of the suppressor compound is between about 1000 and about 30,000.

In another aspect the invention is directed to a method for electrolytically plating Cu onto a substrate employing the foregoing composition.

In another aspect the invention is directed to a method for electroplating a copper deposit onto a semiconductor integrated circuit device substrate with electrical interconnect features including submicron-sized features having bottoms, sidewalls, and top openings, the method comprising immersing the semiconductor integrated circuit device substrate into the electrolytic plating composition comprising a source of Cu ions in an amount sufficient to electrolytically deposit Cu onto the substrate and into the electrical interconnect features, an accelerator, and a suppressor; and supplying electrical current to the electrolytic composition to deposit Cu onto the substrate and superfill the submicron-sized features by rapid bottom-up deposition at a vertical Cu deposition growth rate in features from the bottoms of the features to the top openings of the features which is greater than 50% faster than a comparable vertical Cu deposition growth rate of comparable process which is equivalent in all respects except that it employs a commercially available suppressor.

Other objects and features will be in part apparent and in part pointed out hereinafter.

DETAILED DESCRIPTION OF THE INVENTION

Figure 1:
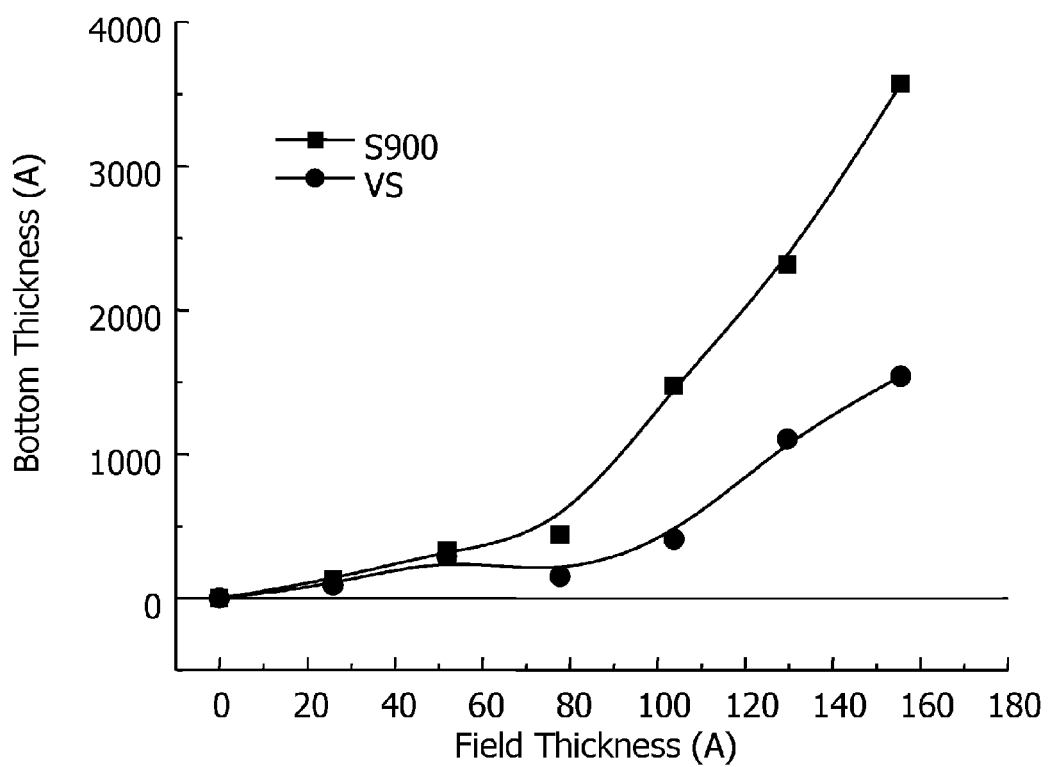
FIG. 1 is a graph comparing the fill speeds of electrolytic plating baths comprising a suppressor compound of the present invention (⊗) against the fill speed of an electrolytic plating bath comprising a commercially available suppressor compound (●). The electrolytic plating bath comprising the suppressor compound of the present invention comprises the bath components listed in Example 1 and was plated according to the method of Example 7. The electrolytic plating bath comprising the commercially available suppressor compound comprises the bath components listed in Comparative Example 1 and was plated according to the method of Example 7.

In accordance with this invention, compositions are provided suitable for plating semiconductor integrated circuit substrates having challenging fill characteristics, such as interconnect features that are poorly seeded or not substantially seeded, interconnect features having a complex geometry, and large diameter interconnect features as well as small diameter features (less than about 0.5 μm), and features with high aspect ratios (at least about 3:1) or low aspect ratios (less than about 3:1) where Cu must fill all the features completely and substantially defect-free.

The compositions for Cu superfilling of semiconductor integrated circuit substrates having challenging fill characteristics of the present invention comprise a suppressor compound and a source of Cu ions. These compositions also typically comprise a leveler, an accelerator, and chloride. The above-listed additives find application in high Cu metal/low acid electrolytic plating baths, in low Cu metal/high acid electrolytic plating baths, and in mid acid/high Cu metal electrolytic plating baths. The compositions can also comprise other additives which are known in the art such as halides, grain refiners, quaternary amines, polysulfide compounds, and others. Compositions comprising the suppressor, leveler, and accelerator of the present invention can be used to fill small diameter/high aspect ratio features.

Preferred suppressors for the Cu plating compositions of the present invention comprise polyether groups covalently bonded to a cationic species. The cationic polyether suppressor preferably comprises a nitrogen atom. Exemplary cationic species comprising a nitrogen atom include primary, secondary, tertiary, and quaternary amines. By "cationic," it is meant that the polyether suppressor either contains or can contain a positive charge in solution. Primary, secondary, and tertiary amines are weakly basic and become protonated and positively charged when added to a solution comprising an acid. Quaternary amines comprise four nitrogen-substituents, and a quaternized nitrogen possesses a positive charge regardless of the solution pH. The primary, secondary, tertiary, and quaternary amines can be substituted or unsubstituted alkyl amines, substituted or unsubstituted cycloalkyl amines, substituted or unsubstituted aromatic amines, substituted or unsubstituted heteroaryl amines, substituted or unsubstituted alkylether amines, and substituted or unsubstituted aromatic alkyl amines.

The suppressors comprising polyether groups covalently bonded to a cationic species preferably comprise at least one amine functional group, preferably between two amine functional groups and five amine functional groups. Accordingly, the cationic species can be an amine, a diamine, a triamine, a tetraamine, a pentaamine, or an even higher amine. The alkyl group of the alkylamine can be a substituted or unsubstituted alkyl, preferably a short chain hydrocarbon having between 1 and 8 carbons, which may be branched or straight chained. Exemplary alkylamines can include methylamine, ethylamine, propylamine, n-butylamine, isobutylamine, t-butylamine, ethylenediamine, diethylenetriamine, 1,3-diaminopropane, 1,4-diaminobutane, 2-butene-1,4-diamine, and others. The cycloalkyl group of the cycloalkyl amine typically comprises a 5- or 6-carbon ring, although bicylic, tricylic, and higher multi-cyclic alkyl amines are applicable. Exemplary cycloalkyl amines include substituted or unsubstituted cyclopentylamines, cyclohexylamines, cyclopentylamines, cyclopentyldiamines, cyclohexylamines, cyclopentylamines, cylcoalkyltriamines, and higher cycloalkyl amines. Alkylether amines preferably comprise an ether moiety defined by short chain hydrocarbons typically having between 1 and 8 carbons, such as diethylene glycol diamine and triethylene glycol diamine.

The polyethers comprise a chain of repeat units, wherein the chain of repeat units can be formed by the polymerization of epoxide monomers. In a preferred embodiment, the epoxide monomers are selected from ethylene oxide monomer, propylene oxide monomer, and a combination thereof. Preferably, the polyether comprises a chain of repeat units formed by the polymerization of both ethylene oxide monomer and propylene oxide monomer. Accordingly, the ratio of ethylene oxide (EO) repeat units and propylene oxide (PO) repeat units in the polyether can be between about 1:9 and about 9:1. In one embodiment, the ratio is between about 2:3 and about 3:2, such as about 1:1. In one embodiment, the polyether comprises between about 1 and about 30 EO repeat units and between about 30 and about 1 PO repeat units, such as between about 7 and about 15 EO repeat units and between about 15 and about 7 PO repeat units. In a currently preferred embodiment, the polyether comprises, for example, about 11 EO repeat units and about 13 PO repeat units. In another preferred embodiment, the polyether comprises about 7 or 8 EO repeat units and about 9 PO repeat units. Accordingly, the molecular weight of the polyether can be between as low as about 100 g/mol and as high as about 3600 g/mol, preferably between about 1000 g/mol and about 1800 g/mol, and in one embodiment, between about 1200 g/mol and about 1400 g/mol.

The polyether preferably comprises EO repeat units and PO repeat units in random, alternating, or block configurations. In a random configuration, the EO repeat units and PO repeat units have no discernable linear pattern along the polyether chain. In an alternating configuration, the EO repeat units and PO repeat units alternate according to some defined pattern, such as repeating units of EO-PO, PO-EO, and other alternating patterns. The co-polymer can be arranged in a block configuration. In the block configuration, the linear portion of the polyether chain comprises a block of EO repeat units bonded to a block of PO repeat units. The polyether chain may comprise a diblock. That is, the chain may comprise a first block of EO repeat units bonded to a second block of PO repeat units. Alternatively, the chain may comprise a first block of PO repeat units bonded to a second block of EO repeat units. In more complicated block configurations, the polyether chain may comprise a triblock (EO block-PO block-EO block or PO block-EO block-PO block), tetrablock, pentablock, or higher block arrangements. It has been discovered that a PO block-EO block-PO triblock configuration is effective to reduce polyether suppressor foaming in electrolytic solution. In one embodiment of the block configuration, each block of repeat units comprises between about 1 and about 30 repeat units, more preferably between about 7 and about 15 repeat units. In a preferred embodiment involving a PO block-EO block-PO block tri-block configuration, the first PO-block bonded to the cationic species comprises between about 7 and about 15 PO repeat units, the second EO-block bonded to the PO-block comprises between about 7 and about 15 repeat units, and the third PO-block bonded to the second EO-block comprises between about 1 and about 5 repeat units.

Optionally, the PO/ED polyethers are capped by a substituted or unsubstitute alkyl group, aryl group, aralkyl, or heteroalkyl group. A preferred capping moiety for its ease of manufacture and low cost is a methyl group.

The suppressor compounds comprising polyether groups covalently bonded to a cationic species comprise a positive charge in acidic solution and repeat units, EO and PO. It is thought that the separate functionalities of the positive charge, the EO repeat units, and the PO repeat units contribute different chemical and physical properties which affect, and thereby enhance, the function of the polyether as a suppressor in the Cu plating compositions of the present invention. Without being bound to a particular theory, it is thought that the positive charge of the cationic species enhances the attraction of the suppressor compound to Cu deposited into interconnect features, which, during an electrolytic plating operation, functions as the cathode. It is believed that the PO repeat unit is the active repeat unit in the suppressors of the present invention. That is, the PO repeat unit has suppressor functionality and affects the quality of the Cu deposit. Without being bound to a particular theory, it is thought that the PO repeat units, being relatively hydrophobic form a polarizing film over a Cu seed layer and electrolytically deposited Cu.

A Cu seed layer is typically deposited over the barrier layer in interconnect features by CVD, PVD, and other methods known in the art. The Cu seed layer acts as the cathode for further reduction of Cu that superfills the interconnects during the electrolytic plating operation. Cu seed layers can be thin, i.e., less than about 700 Angstroms. Or they may be thick, i.e., between about 700 Angstroms and about 1500 Angstroms. However, the copper thickness on the bottom or sidewall of features is typically much thinner than those on the feature top and unpatterned areas due to the non-uniform deposition rates of PVD processes. In some extreme circumstances, the copper coverage on the bottom or sidewall could be so thin that the seed is discontinuous. Accordingly, in some instances the substrate comprises surface portions which have a Cu seed thereon which is less than about 700 angstroms thick, and in some instances the seed is discontinuous. In another case, the seed coverage on the top of features is thicker than on other feature areas, which is often called "seed overhang." Generally, the uniformity of seed coverage degrades significantly with shrinking feature size and increasing aspect ratio. The present invention has been shown to perform well, and better than the prior art, with thin or overhanged seed layers.

The suppressor compound with somewhat hydrophobic PO repeat units covalently bonded to a nitrogen-containing cationic species is able to form a suppressive film over the Cu seed layer. In the case of thin copper seed coverage, this polarizing organic film will cause the current to be more evenly distributed over the entire interconnect feature, i.e., the bottom and sidewalls of the via or trench. Even current distribution is believed to promote faster bottom up growth relative to sidewall growth, and may also reduce or eliminate bottom and sidewall voiding. This strongly suppressive suppressor is also desirable to suppress copper growth at the seed overhang areas on the top of the interconnect features, reducing the formation of internal voids from early pinching off. It has been discovered that the suppressor compound comprising a polyether group covalently bonded to a cationic species of the present invention is effective at suppressing Cu deposition over thin or thick Cu seed layers. A polyether constituted only of PO repeat units, being relatively hydrophobic, lacks the solubility necessary to act as an adequate suppressor. That is, while PO is a superior suppressor, a polymer constituted only of PO repeat units may not be soluble enough to go into the Cu plating solution so that it can adsorb onto the Cu seed layer in a high enough concentration to form a polarizing film. Accordingly, the polyether group further comprises EO repeat units to enhance its hydrophilicity and thus its solubility.

In those embodiments where the cationic species comprises a nitrogen atom, the nitrogen atom can be covalently bonded to one, two, or three PO/EO polyethers. Preferably, the nitrogen atom is covalently bonded to two PO/EO polyethers. In embodiments where the cationic species is a primary, secondary, or tertiary amine, the nitrogen atom can be alkylated to quaternize the nitrogen atom and render it positively charged. Preferably, the alkyl group is a short chain hydrocarbon radical having between 1 and 8 carbons, such as methyl, ethyl, n-propyl, isopropyl, and the like. Preferably the alkyl group is a methyl group. Accordingly, the nitrogen atom can form a quaternary amine having a positive charge where the suppressor comprises, for example, two PO/EO polyethers covalently bonded to a methylated alkylamine.

In those embodiments where the cationic species comprises a nitrogen atom, the cationic species can have any of the following structures (1), (2), (3), or (4):

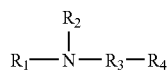

(1)

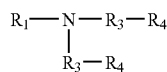

(2)

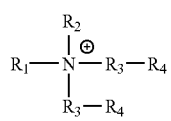

(3)

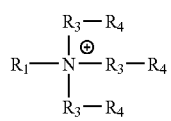

(4)

wherein $R_1$ is a substituted or unsubstituted alkyl group, preferably a straight chained or branched alkyl group having between 1 and 8 carbons, and preferably, $R_1$ is substituted with another amino group to which a polyether group is covalently bonded, the polyether group comprising EO repeat units, PO repeat units, or a combination thereof arranged in random, alternating, or block configurations, $R_2$ is selected from the group consisting of hydrogen and alkyl group, and where $R_2$ is an alkyl group, it is preferably a methyl group, $R_3$ is a polyether group preferably comprising EO repeat units, PO repeat units, or a combination thereof arranged in random, alternating, or block configurations, and $R_4$ is selected from the group consisting of hydrogen, substituted or unsubstituted alkyl group, aryl group, aralkyl, or heteroaryl group.

The suppressor compounds of the invention have a molecular weight between about 1000 and about 30,000. Exemplary suppressor compounds comprising a polyether group covalently bonded to a cationic species wherein the polyether is covalently bonded to a nitrogen atom are shown by structures (5), (6), (7), (8), and (9) below.

Structure (5) is a PO/EO block copolymer of ethylenediamine having the structure:

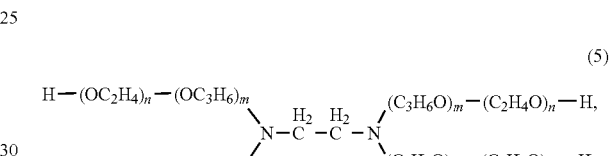

(5)

and wherein n can be between 1 and about 30 and m can be between 1 and about 30. Accordingly a suppressor compound having the structure (5) comprises between about 4 and about 120 total PO repeat units and between about 4 and about 120 total EO repeat units on the four PO/EO block copolymers. The molecular weight of the PO (hydrophobic unit) block on a single PO/EO block copolymer can be between about 50 g/mol and about 1800 g/mol, and the molecular weight of the EO (hydrophilic unit) block on a single PO/EO block copolymer can be between about 40 g/mol and about 1400 g/mol. The molecular weight of a single PO/EO copolymer can be between about 100 g/mol about 3600 g/mol. An exemplary suppressor compound having the structure (5) is available from BASF Corporation of Mt. Olive, N.J. under the trade designation Tetronic® 704. This suppressor compound comprises about 13 PO repeat units per PO/EO block copolymer for a total of about 52 PO repeat units on all four PO/EO block copolymers and about 11 EO repeat units per PO/EO block copolymer for a total of about 44 EO repeat units on all four PO/EO block copolymers. Accordingly, the total MW of Tetronic® 704 is between about 5000 g/mol and about 5500 g/mol. Another exemplary block copolymer of structure (5) is also available from BASF Corporation under the trade designation Tetronic® 504. This suppressor compound comprises about 9 PO repeat units per PO/EO block copolymer for a total of about 36 PO repeat units on all four PO/EO block copolymers and about 7.5 EO repeat units per PO/EO block copolymer for a total of about 30 EO repeat units on all four PO/EO block copolymers. Accordingly, the total MW of Tetronic® 504 is between about 3200 g/mol and about 3600 g/mol. The bath composition can comprise a mixture of block copolymers of structure (5).

Structure (6) is an N-methylated PO/EO block copolymer of ethylenediamine having the general structure:

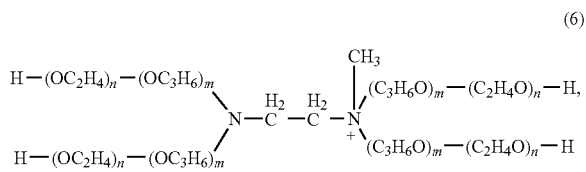

(6)

wherein n can be between 1 and about 30 and m can be between 1 and about 30. A source of the suppressor compound having structure (6) is N-methylated Tetronic® 504 or N-methylated Tetronic® 704.

Structure (7) is a methyl-capped PO/EO block copolymer of ethylenediamine having the general structure:

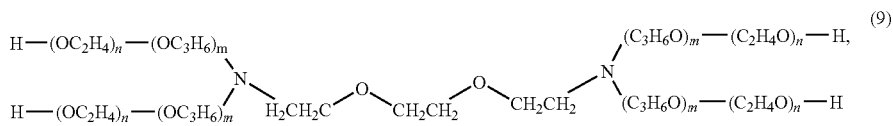

(7)

and wherein n can be between 1 and about 30 and m can be between 1 and about 30. A source of the suppressor compound having structure (7) is methyl-capped Tetronic® 504 or methyl-capped Tetronic® 704. In various alternatives, one of the terminal oxygen atoms can be bonded to a methyl group and the other three terminal oxygen atoms can be bonded to a hydrogen atom; or two of the terminal oxygen atoms can be bonded to a methyl group and two of the terminal oxygen atoms can be bonded to a hydrogen atom; or three of the terminal oxygen atoms can be bonded to a methyl group and one of the terminal oxygen atoms can be bonded to a hydrogen atom; or all of the terminal oxygen atoms can be bonded to a methyl group.

In yet another alternative, the block copolymer is methylated and capped as described above, as long as the cloud point is such that it is compatible with copper solution.

Structure (8) is a PO/EO/PO tri-block copolymer of ethylenediamine having the general structure:

and wherein n can be between 1 and about 30, m can be between 1 and about 30, and o can be between about 1 and about 5, or such that the cloud point is compatible with copper solution. Preferably, o is 1 or 2. A source of a suppressor compound having structure (8) is PO-capped Tetronic® 504 or PO-capped Tetronic® 704.

Structure (9) is a PO/EO block copolymer of triethylene glycol diamine having the structure:

(9)

and wherein n can be between 1 and about 30 and m can be between 1 and about 30. Triethylene glycol diamine, to which the PO/EO block co-polymers can be covalently bonded, is available from Huntsman LLC of Salt Lake City, Utah under the trade designation Jeffamine XTJ-504. The structure of the PO/EO block copolymer in suppressor compounds having structure (9) can be substantially the same as the PO/EO block copolymers in Tetronic® 504 and Tetronic® 704. Accordingly, the MW of a suppressor compound having structure (9) can be between about 5200 g/mol and about 5800 g/mol.

The suppressor compounds described above can be present in an overall bath concentration between about 10 mg/L to about 1000 mg/L, preferably between about 50 mg/L to about 200 mg/L. Adding the weakly cationic polyether suppressors to Cu plating compositions within these concentration ranges is sufficient to fill complex features in an integrated circuit device, with the added benefits of reducing early pinching off, bottom voiding, or sidewall voiding.

The composition of the invention also preferably includes a leveler which has an enhanced leveling effect without substantially interfering with superfilling of Cu into high aspect ratio features. One such preferred leveler is disclosed in U.S. Pat. Pub. No. 2005/0045488, filed Oct. 12, 2004, the entire disclosure of which is expressly incorporated by reference. This leveler does not substantially interfere with superfilling, so the Cu bath can be formulated with a combination of accelerator and suppressor additives which provides a rate of growth in the vertical direction which is substantially greater than the rate of growth in the horizontal direction, and even more so than in conventional superfilling of larger interconnects. One such preferred leveler is a reaction product of 4-vinyl pyridine and methyl sulfate available from Enthone

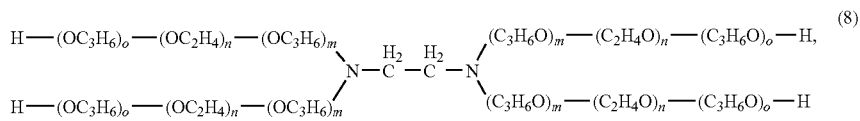

(8)

Inc. under the trade name ViaForm L700. The leveler is incorporated, for example, in a concentration between about 0.1 mg/L and about 25 mg/L.

With regard to accelerators, in a system currently preferred by the applicants, the accelerators are bath soluble organic divalent sulfur compounds as disclosed in U.S. Pat. No. 6,776,893, the entire disclosure of which is expressly incorporated by reference. In one preferred embodiment, the accelerator corresponds to the formula (10)

$$R_1—(S)_n RXO_3 M \quad (10),$$

wherein

M is hydrogen, alkali metal or ammonium as needed to satisfy the valence;

X is S or P;

R is an alkylene or cyclic alkylene group of 1 to 8 carbon atoms, an aromatic hydrocarbon or an aliphatic aromatic hydrocarbon of 6 to 12 carbon atoms;

n is 1 to 6; and $R_1$ is $MO_3 XR$ wherein M, X and R are as defined above.

An accelerator which is especially preferred is 1-propanesulfonic acid, 3,3'-dithiobis, disodium salt according to the following formula (11):

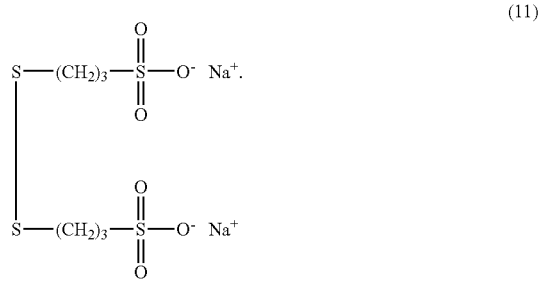

The accelerator is incorporated typically in a concentration between about 0.5 and about 1000 mg/L, more typically between about 2 and about 50 mg/L, such as between about 5 and 30 mg/L. A significant aspect of the current invention is that it permits the use of a greater concentration of accelerator, and in many applications in fact it must be used in conjunction with a greater concentration of accelerator than in conventional processes. This permits achieving the enhanced rates of superfilling demonstrated in Example 7 below.

Optionally, additional leveling compounds of the following types can be incorporated into the bath such as the reaction product of benzyl chloride and hydroxyethyl polyethylenimine as disclosed in U.S. Pat. Pub. No. 2003/0168343, the entire disclosure of which is expressly incorporated herein by reference.

The components of the Cu electrolytic plating bath may vary widely depending on the substrate to be plated and the type of Cu deposit desired. The electrolytic baths include acid baths and alkaline baths. A variety of Cu electrolytic plating baths are described in the book entitled Modern Electroplating, edited by F. A. Lowenheim, John Reily & Sons, Inc., 1974, pages 183-203. Exemplary Cu electrolytic plating baths include Cu fluoroborate, Cu pyrophosphate, Cu cyanide, Cu phosphonate, and other Cu metal complexes such as methane sulfonic acid. The most typical Cu electrolytic plating bath comprises Cu sulfate in an acid solution.

The concentration of Cu and acid may vary over wide limits; for example, from about 4 to about 70 g/L Cu and from about 2 to about 225 g/L acid. In this regard the compounds of the invention are suitable for use in all acid/Cu concentration ranges, such as high acid/low Cu systems, in low acid/high Cu systems, and mid acid/high Cu systems. In high acid/low Cu systems, the Cu ion concentration can be on the order of 4 g/L to on the order of 30 g/L; and the acid concentration may be sulfuric acid in an amount of greater than about 100 g/L up to about 225 g/L. In one high acid/low Cu system, the Cu ion concentration is about 17 g/L where the $H_2SO_4$ concentration is about 180 g/L. In low acid/high Cu systems, the Cu ion concentration can be on the order of greater than about 30 g/L, 40 g/L, and even up to on the order of 60 g/L Cu (50 g/L Cu corresponds to 200 g/L $CuSO_4.5H_2O$ Cu sulfate pentahydrate). The acid concentration in these systems is less than 50 g/L, 40 g/L, and even 30 g/L $H_2SO_4$, down to about 2 g/L. In one exemplary low acid/high Cu system, the Cu concentration is about 40 g/L and the $H_2SO_4$ concentration is about 10 g/L. In mid acid/high Cu systems, the Cu ion concentration can be on the order of 30 g/L to on the order of 60 g/L; and the acid concentration may be sulfuric acid in an amount of greater than about 50 g/L up to about 100 g/L. In one mid acid/high Cu system, the Cu ion concentration is about 50 g/L where the $H_2SO_4$ concentration is about 80 g/L.

Chloride ion may also be used in the bath at a level up to 200 mg/L, preferably about 10 to 90 mg/L. Chloride ion is added in these concentration ranges to enhance the function of other bath additives. These additives system include accelerators, suppressors, and levelers.

A large variety of additives may typically be used in the bath to provide desired surface finishes for the Cu plated metal. Usually more than one additive is used with each additive forming a desired function. At least two additives are generally used to initiate bottom-up filling of interconnect features as well as for improved metal plated physical (such as brightness), structural, and electrical properties (such as electrical conductivity and reliability). Particular additives (usually organic additives) are used for grain refinement, suppression of dendritic growth, and improved covering and throwing power. Typical additives used in electrolytic plating are discussed in a number of references including Modern Electroplating, cited above. A particularly desirable additive system uses a mixture of aromatic or aliphatic quaternary amines, polysulfide compounds, and polyethers. Other additives include items such as selenium, tellurium, and sulfur compounds.

Plating equipment for plating semiconductor substrates are well known and are described in, for example, Haydu et al. U.S. Pat. No. 6,024,856. Plating equipment comprises an electrolytic plating tank which holds Cu electrolytic solution and which is made of a suitable material such as plastic or other material inert to the electrolytic plating solution. The tank may be cylindrical, especially for wafer plating. A cathode is horizontally disposed at the upper part of tank and may be any type substrate such as a silicon wafer having openings such as trenches and vias. The wafer substrate is typically coated first with a barrier layer, which may be titanium nitride, tantalum, tantalum nitride, or ruthenium to inhibit Cu diffusion and next with a seed layer of Cu or other metal to initiate Cu superfilling plating thereon. A Cu seed layer may be applied by chemical vapor deposition (CVD), physical vapor deposition (PVD), or the like. An anode is also preferably circular for wafer plating and is horizontally disposed at the lower part of tank forming a space between the anode and cathode. The anode is typically a soluble anode such as copper metal.

The bath additives are useful in combination with membrane technology being developed by various tool manufacturers. In this system, the anode may be isolated from the organic bath additives by a membrane. The purpose of the separation of the anode and the organic bath additives is to minimize the oxidation of the organic bath additives on the anode surface.

The cathode substrate and anode are electrically connected by wiring and, respectively, to a rectifier (power supply). The cathode substrate for direct or pulse current has a net negative charge so that Cu ions in the solution are reduced at the cathode substrate forming plated Cu metal on the cathode surface. An oxidation reaction takes place at the anode. The cathode and anode may be horizontally or vertically disposed in the tank.

During operation of the electrolytic plating system, Cu metal is plated on the surface of a cathode substrate when the rectifier is energized. A pulse current, direct current, reverse periodic current, or other suitable current may be employed. The temperature of the electrolytic solution may be maintained using a heater/cooler whereby electrolytic solution is removed from the holding tank and flows through the heater/cooler and then is recycled to the holding tank.

In the case of thin copper seed coverage, less current will be delivered to the lower portions of interconnect features, which may lead to bottom or sidewall voids and slow bottom-up growth. For features which have seed overhang, the electrolytic copper growth may have early pinching off on the feature tops before the bottom-up growth can reach the surface. Conventional suppressors may not distribute enough current to the bottom of the interconnect feature to promote bottom-up superfilling rapid enough to prevent the pinching off of interconnect features by Cu electrolytic deposition leading to the formation of internal voids, especially for features seeded with a thin Cu seed layer. Also, conventional suppressors may not have strong enough suppression to suppress copper growth on seed overhang areas to prevent early pinching off. Without being bound to a particular theory, it is thought that the suppressor compounds of the present invention function to inhibit the formation of internal voids and enhance the bottom-up superfilling deposition rate by up to twice the rate over a typical electrolytic plating solution not comprising the suppressor compounds of the present invention by forming a polarizing film over the Cu seed layer. Also, the suppressor compounds of the present invention possess stronger suppression (more polarizing) than most conventional suppressors, which allows the current to be distributed more evenly over the Cu seed layer deposited on the bottom and sidewalls of the interconnect feature leading to the reduction or elimination of bottom and sidewall voids. An even current distribution enhances Cu growth at the bottom of the feature relative to deposition at other regions to such an extent that bottom-up superfilling occurs so rapidly that deposition at the side and top of the feature will not cause a pinching off of the deposit and the formation of internal voids. The suppressor compounds of the present invention are effective at rapid bottom-up superfilling over thin or overhanged Cu seed layers. For example, the suppressor compounds have been found effective to superfill an interconnect feature seeded with a thin Cu seed layer on the bottom and side walls of an interconnect feature having a thickness between about 1 Angstrom and about 100 Angstroms.

An advantage of adding the suppressor compounds of the present invention to electrolytic Cu plating solutions is the reduction in the occurrence of internal voids as compared to deposits formed from a bath not containing these compounds. Internal voids form from Cu depositing on the feature side walls and top entry of the feature, which causes pinching off and thereby closes access to the depths of the feature. This defect is observed especially with features which are small (e.g., <100 nm) and/or which have a high aspect ratio (depth:width), for example, >4:1. Those voids left in the feature can interfere with electrical connectivity of copper interconnects. The suppressor compounds of the invention appear to reduce the incidence of internal voids by the above-described rapid superfilling mechanism and strong suppression.

It is an optional feature of the process that the plating system be controlled as described in U.S. Pat. No. 6,024,856 by removing a portion of the electrolytic solution from the system when a predetermined operating parameter (condition) is met and new electrolytic solution is added to the system either simultaneously or after the removal in substantially the same amount. The new electrolytic solution is preferably a single liquid containing all the materials needed to maintain the electrolytic plating bath and system. The addition/removal system maintains a steady-state constant plating system having enhanced plating effects such as constant plating properties. With this system and method the plating bath reaches a steady state where bath components are substantially a steady-state value.

Electrolysis conditions such as electric current concentration, applied voltage, electric current density, and electrolytic solution temperature are essentially the same as those in conventional electrolytic Cu plating methods. For example, the bath temperature is typically about room temperature such as about 20-27° C., but may be at elevated temperatures up to about 40° C. or higher. The electrical current density is typically up to about 100 mA/cm$^2$, typically about 2 mA/cm$^2$ to about 60 mA/cm$^2$. It is preferred to use an anode to cathode ratio of about 1:1, but this may also vary widely from about 1:4 to 4:1. The process also uses mixing in the electrolytic plating tank which may be supplied by agitation or preferably by the circulating flow of recycle electrolytic solution through the tank. The flow through the electrolytic plating tank provides a typical residence time of electrolytic solution in the tank of less than about 1 minute, more typically less than 30 seconds, e.g., 10-20 seconds.

The following examples further illustrate the practice of the present invention.

EXAMPLES

Example 1

Low Acid/High Cu Superfill Electrolytic Plating Bath with Suppressor of the Invention To superfill a small diameter/high aspect ratio integrated circuit device feature, a Low acid/High Cu electrolytic plating bath was prepared comprising the following components:

160 g/L CuSO$_4$.5H$_2$O (copper sulfate pentahydrate)

10 g/L H$_2$SO$_4$ (concentrated sulfuric acid)

50 mg/L Chloride ion 9 mL/L ViaForm® Accelerator 200 mg/L of Cationic Suppressor (PO/EO block copolymer of ethylenediamine having a MW of 5500 g/mol corresponding to structure (5)).

The bath (1 L) was prepared as follows. CuSO$_4$.5H$_2$O (160 g) was fully dissolved in deionized water. Concentrated sulfuric acid (10 g) was added followed by addition of hydrochloric acid sufficient to yield 50 mg chloride ion in solution. Deionized water was added for a total volume of 1 liter. The final plating bath was prepared by further addition of ViaForm Accelerator (9 mL) and PO/EO block copolymer of ethylenediamine having a MW of 5500 g/mol corresponding to structure (5) (200 mg).

Comparative Example 1

Low Acid/High Cu Superfill Electrolytic Plating Bath with Comparative Suppressor A comparative Low acid/High Cu electrolytic plating bath was prepared comprising the following components:
- 160 g/L CuSO$_4$.5H$_2$O (copper sulfate pentahydrate)
- 10 g/L H$_2$SO$_4$ (concentrated sulfuric acid)
- 50 mg/L Chloride ion
- 9 mL/L ViaForm® Accelerator
- 200 mg/L Commercially Available Suppressor having the following formula:

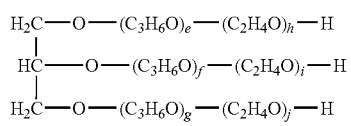

wherein the sum of e+f+g=21 and the sum of h+i+j=27, available from Enthone Inc. under the tradename ViaForm.

Example 2

High Acid/Low Cu Superfill Electrolytic Plating Bath with Suppressor of the Invention To superfill a small diameter/high aspect ratio integrated circuit device feature, a High Acid/Low Cu electrolytic plating bath was prepared comprising the following components:
- 70 g/L CuSO$_4$.5H$_2$O (copper sulfate pentahydrate)
- 180 g/L H$_2$SO$_4$ (concentrated sulfuric acid)
- 50 mg/L Chloride ion
- 3 mL/L ViaForm® Accelerator
- 400 mg/L Cationic Suppressor (PO/EO block copolymer of ethylenediamine having a MW of 5500 g/mol corresponding to structure (5)).

Example 3

Mid Acid/High Cu Superfill Electrolytic Plating Bath with Suppressor of the Invention To superfill a small diameter/low aspect ratio integrated circuit device feature, a Mid acid/High Cu electrolytic plating bath was prepared comprising the following components:
- 200 g/L CuSO$_4$.5H$_2$O (copper sulfate pentahydrate)
- 80 g/L H$_2$SO$_4$ (concentrated sulfuric acid)
- 50 mg/L Chloride ion
- 8 mL/L ViaForm® Accelerator
- 200 mg/L Cationic Suppressor (PO/EO block copolymer of ethylenediamine having a MW of 5500 g/mol corresponding to structure (5))
- 4 mL/L ViaForm® L700.

Example 4

Low Acid/High Cu Superfill Electrolytic Plating Bath with Suppressor of the Invention To superfill a small diameter/high aspect ratio integrated circuit device feature, a High Acid/Low Cu electrolytic plating bath was prepared comprising the following components:
- 160 g/L CuSO$_4$.5H$_2$O (copper sulfate pentahydrate)
- 10 g/L H$_2$SO$_4$ (concentrated sulfuric acid)
- 50 mg/L Chloride ion
- 18 mg/L 1-propanesulfonic acid, 3,3'-dithiobis, disodium salt
- 200 mg/L Cationic Suppressor (PO/EO block copolymer of triethylene glycol diamine having a MW of 5700 g/mol corresponding to structure (9))
- 2 mL/L ViaForm® L700.

Example 5

Low Acid/High Cu Superfill Electrolytic Plating Bath with Suppressor of the Invention A comparative Low acid/High Cu electrolytic plating bath was prepared comprising the following components:
- 160 g/L CuSO$_4$.5H$_2$O (copper sulfate pentahydrate)
- 10 g/L H$_2$SO$_4$ (concentrated sulfuric acid)
- 50 mg/L Chloride ion
- 9 mL/L ViaForm Accelerator
- 200 mg/L Cationic Suppressor (PO/EO block copolymer of ethylenediamine having a MW of 3400 g/mol corresponding to structure (5)).

Comparative Example 5

Low Acid/High Cu Superfill Electrolytic Plating Bath with Comparative Suppressor To superfill a small diameter/high aspect ratio integrated circuit device feature, a Low acid/High Cu electrolytic plating bath was prepared comprising the following components:
- 160 g/L CuSO$_4$.5H$_2$O (copper sulfate pentahydrate)
- 10 g/L H$_2$SO$_4$ (concentrated sulfuric acid)
- 50 mg/L Chloride ion
- 9 mL/L ViaForm® Accelerator
- 200 mg/L Commercially Available Suppressor of Example 1.

Example 6

Low Acid/High Cu Superfill Electrolytic Plating Bath with Suppressor of the Invention To superfill a small diameter/high aspect ratio integrated circuit device feature, a Low acid/High Cu electrolytic plating bath was prepared comprising the following components:
- 160 g/L CuSO$_4$.5H$_2$O (copper sulfate pentahydrate)
- 10 g/L H$_2$SO$_4$ (concentrated sulfuric acid)
- 50 mg/L Chloride ion
- 9 mL/L ViaForm® Accelerator
- 200 mg/L Cationic Suppressor (PO/EO/PO block copolymer of triethylene glycol diamine having a MW of 5600 g/mol corresponding to structure (8)).

Example 7

Superfilling Test Trenches with Low Acid/High Cu Superfill Electrolytic Plating Bath Test trenches (140 nm; aspect ratio between 3 and 4:1)) were superfilled with Cu using the low acid/high Cu electrolytic plating bath of Example 1 comprising a cationic suppressor of the invention and compared to test trenches superfilled with Cu using the low acid/high Cu electrolytic plating bath of Comparative Example 1 comprising a commercially available suppressor.

The test trenches superfilled with the bath of Example 1 filled faster (i.e., more growth on the bottom) as compared to the test trenches superfilled with the conventional electrolytic plating bath of Comparative Example 1. FIG. 1 is a graph showing the plating speeds achieved with the bath of Example 1 (⊗) compared to the plating speeds achieved with the bath of Comparative Example 1 (–●–). In both cases, the Cu was deposited at a current density of 7 mA/cm$^2$ for 0 to 6 seconds to compare bottom growth speeds. This illustrates that rapid bottom-up deposition is achieved at a superfill speed by which Cu deposition in a vertical direction from the bottoms of the features to the top openings of the features is greater than 15 times faster and even greater than 20 times faster than Cu deposition on planar surfaces outside the features. That is, for example, the vertical growth rate for the invention is about 3600 angstroms in six seconds, or 600 angstroms per second; while the field thickness growth rate is about 150 angstroms in six seconds, or about 25 angstroms per second. So in this example the vertical growth rate is 24 times the field thickness growth rate (600 v. 25 angstroms/sec). The vertical growth rate for the comparative process is about 1500 angstroms in six seconds, or 250 angstroms per second; while the field thickness growth rate is about 150 angstroms in six seconds, or about 25 angstroms per second (250 v. 25 angstroms/sec). This corresponds to a comparative vertical growth rate of about 10 times the field thickness growth rate. The foregoing deposition growth rates are calculated over the first six seconds of deposition. These data also reveal that the process of the invention achieves a rate of vertical growth in the features which is 1.5 times, or 50%, (e.g., between 1.5 and 3 times) greater than processes comparable in all respects except that they employ the stated commercially available suppressor. "Vertical" in this respect refers to the orientation of the growth with respect to the feature opening and feature bottom, and does not refer to any particular orientation of the substrate with respect to the deposition tank.

Figure 2A:
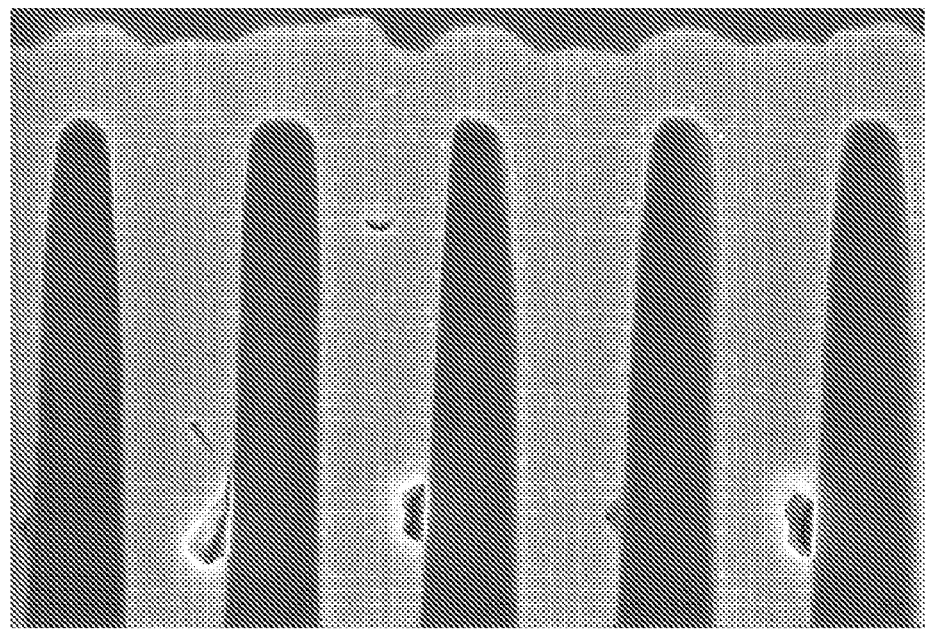
FIGS. 2A and 2B are SEM images showing superfilled test trenches prepared according to the method of Example 7. The trenches in FIG. 2A were filled using an electrolytic plating bath comprising the additives listed in Example 1, including a suppressor compound of the present invention. The trenches in FIG. 2B were filled using an electrolytic plating bath comprising the additives listed in Comparative Example 1, including a commercially available suppressor compound.
Figure 2B:
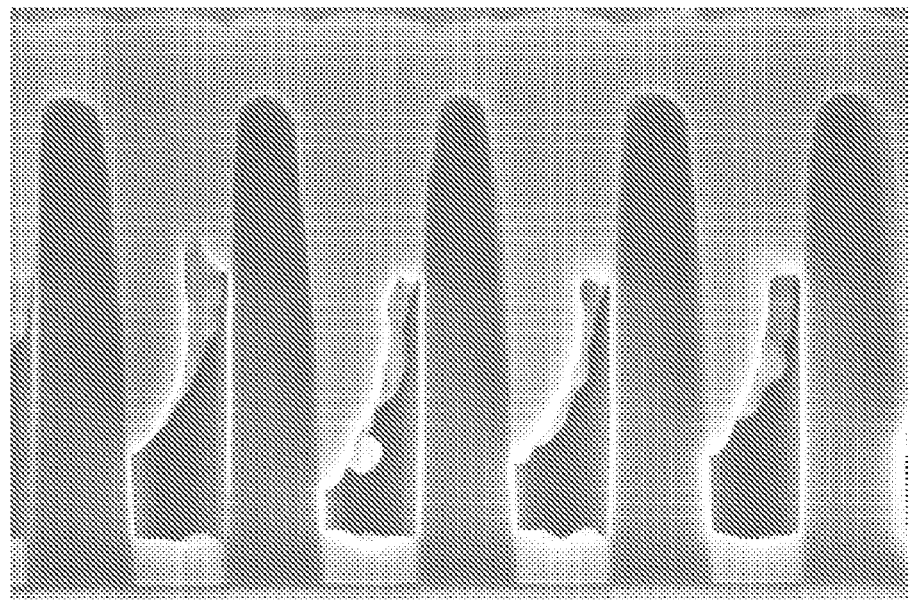

It was also observed that the plating bath of Example 1 deposited Cu on extremely thin or discontinuous seed with significantly less bottom and sidewall voiding as compared to plating with the bath of Comparative Example 1. See FIGS. 2A and 2B, which are SEM image of test vias plated with the bath of Example 1 (FIG. 2A) and the bath of Comparative Example 1 (FIG. 2B). Electrolytic deposition occurred at a current density of 10 mA/cm$^2$. It can be observed that electrolytic plating using the bath of Example 1 resulted in significantly less bottom and sidewall voiding as compared to electrolytic plating using the bath of Comparative Example 1.

Example 8

Figure 3A:
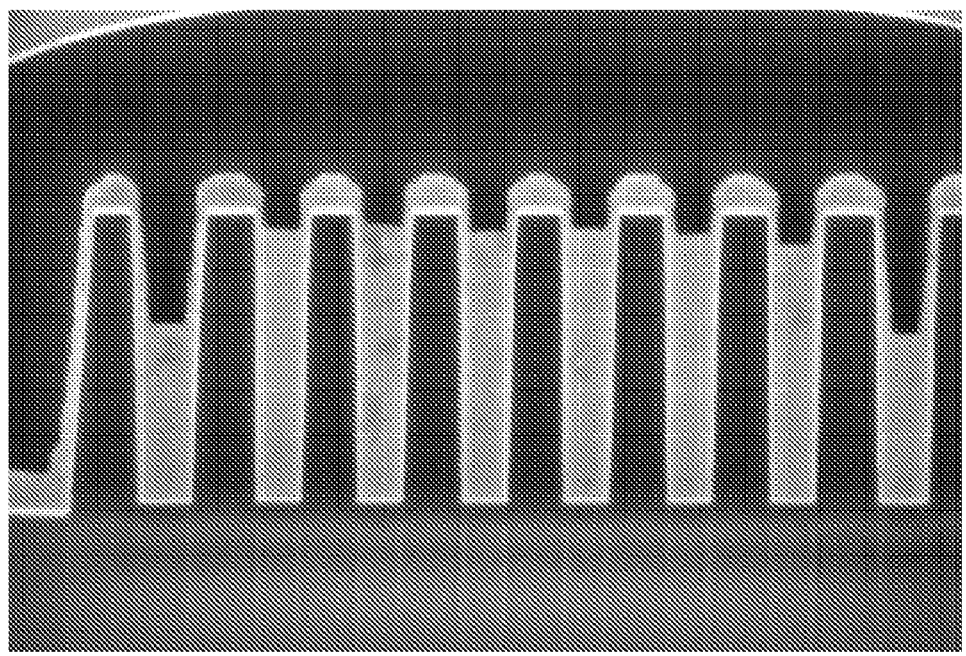
FIGS. 3A and 3B are SEM images showing superfilled test trenches prepared according to the method of Example 8. The trenches in FIG. 3A were filled using an electrolytic plating bath comprising the additives listed in Example 5, including a suppressor compound of the present invention. The trenches in FIG. 3B were filled using an electrolytic plating bath comprising the additives listed in Comparative Example 5, including a commercially available suppressor compound.
Figure 3B:
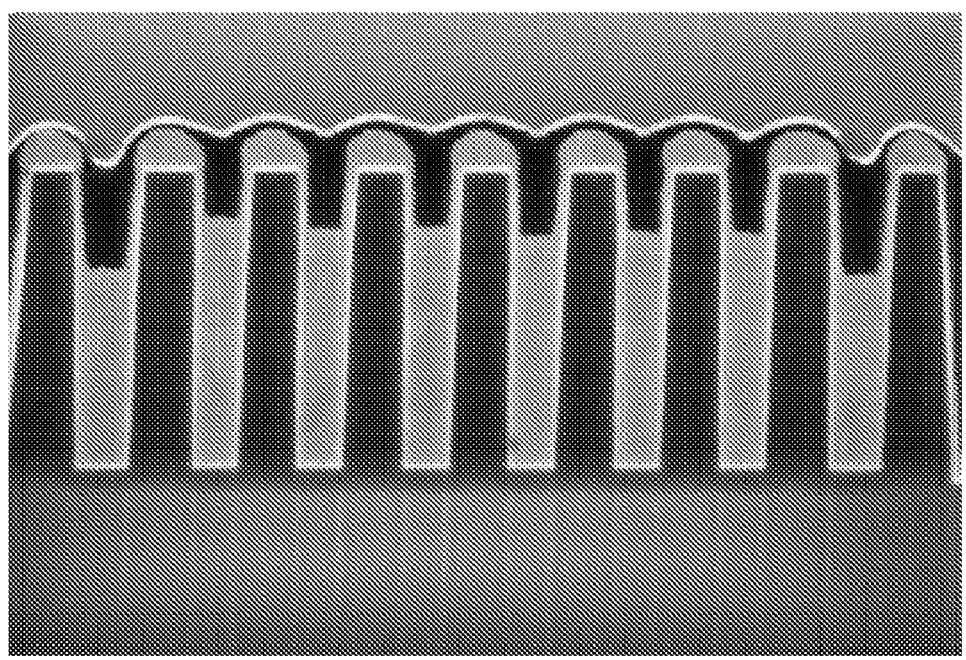

Superfilling Test Trenches with Low Acid/High Cu Superfill Electrolytic Plating Bath Test trenches were superfilled with Cu using the low acid/high Cu electrolytic plating bath of Example 5 comprising a cationic suppressor of the invention and compared to test trenches superfilled with Cu using the low acid/high Cu electrolytic plating bath of Comparative Example 5 comprising a commercially available suppressor. SEM images of the electrolytically plated Cu deposit in the test trenches are shown in FIGS. 3A and 3B. FIG. 3A is an SEM image of the test trenches electrolytically plated with the bath of Example 5. FIG. 3B is an SEM image of the test trenches electrolytically plated with the bath of Comparative Example 5. Both deposits were plated at a current density of 7 mA/cm$^2$ for 10 seconds to reveal the progression of bottom-up growth. It can be seen from the SEM images that superfilling using the bath of Example 5 achieved more complete via filling than electrolytically superfilling using the bath of Comparative Example 5.

When introducing elements of the present invention or the preferred embodiment(s) thereof, the articles "a", "an", "the" and "said" are intended to mean that there are one or more of the elements. For example, that the foregoing description and following claims refer to "an" interconnect means that there are one or more such interconnects. The terms "comprising", "including" and "having" are intended to be inclusive and mean that there may be additional elements other than the listed elements. As various changes could be made in the above without departing from the scope of the invention, it is intended that all matter contained in the above description and shown in the accompanying drawings shall be interpreted as illustrative and not in a limiting sense. The scope of invention is defined by the appended claims and modifications to the embodiments above may be made that do not depart from the scope of the invention.

What is claimed is:

1. An electrolytic plating composition for electrolytically plating Cu onto a semiconductor integrated circuit substrate having a planar plating surface and submicron-sized interconnect features by immersion of the semiconductor integrated circuit substrate into the electrolytic solution, the composition comprising:

a source of Cu ions in an amount sufficient to electrolytically deposit Cu onto the substrate and into the electrical interconnect features; and a suppressor comprising a compound selected from the group consisting of:

(i) a first suppressor compound comprising a polyether group bonded to a nitrogen-containing species, wherein the polyether group comprises a combination of propylene oxide (PO) repeat units and ethylene oxide (EO) repeat units present in a PO:EO ratio between about 1:9 and about 9:1, and wherein the molecular weight of the first suppressor compound is between about 1000 and about 3600 g/mol;

(ii) a second suppressor compound comprising a polyether group bonded to a nitrogen-containing species, wherein the polyether group comprises a combination of propylene oxide (PO) repeat units and ethylene oxide (EO) repeat units present in a PO:EO ratio between about 1:9 and about 9:1, wherein the molecular weight of the second suppressor compound is between about 1000 and about 30,000 g/mol, and wherein the second suppressor compound further comprises a capping moiety selected from the group consisting of an alkyl group or a block polymer comprising propylene oxide repeat units;

(iii) a third suppressor compound comprising a polyether group bonded to a nitrogen-containing species, wherein the polyether group comprises a combination of propylene oxide (PO) repeat units and ethylene oxide (EO) repeat units present in a PO:EO ratio between about 1:9 and about 9:1, wherein the nitrogen-containing species is an alkylether amine, and wherein the molecular weight of the third suppressor compound is between about 1000 and about 30,000 g/mol; and (iv) a fourth suppressor compound comprising a polyether group bonded to a nitrogen-containing species, wherein the polyether group comprises a combination of propylene oxide (PO) repeat units and ethylene oxide (EO) repeat units present in a PO:EO ratio between about 1:9 and about 9:1, wherein the molecular weight of the fourth suppressor compound is between about 1000 and about 30,000 g/mol, and wherein a nitrogen in the nitrogen-containing species is a quaternary amine;

(v) a fifth suppressor compound comprising a polyether group bonded to a nitrogen-containing species, wherein the polyether group comprises a combination of propylene oxide (PO) repeat units and ethylene oxide (EO) repeat units present in a PO:EO ratio between about 1:9 and about 9:1, wherein the molecular weight of the fifth suppressor compound is between about 1000 and about 30,000 g/mol, and wherein the composition comprises less than about 30 g/L acid when the fifth suppressor is selected;

(vi) a sixth suppressor compound comprising a polyether group bonded to a nitrogen-containing species, wherein the polyether group comprises a combination of propylene oxide (PO) repeat units and ethylene oxide (EO) repeat units present in a PO:EO ratio between about 1:9 and about 9:1, wherein the molecular weight of the sixth suppressor compound is between about 1000 and about 30,000 g/mol, and wherein the composition comprises between about 4 g/L and about 30 g/L copper ion when the sixth suppressor is selected; and (vi) combinations thereof.

2. The electrolytic plating composition of claim 1 wherein the propylene oxide repeat units and ethylene oxide repeat units are present in a PO:EO ratio between about 2:3 and about 3:2.

3. The electrolytic plating composition of claim 1 wherein the EO and PO repeat units are arranged in a block co-polymer sequence.

4. The electrolytic plating composition of claim 2 wherein the EO and PO repeat units are arranged in a block co-polymer sequence.

5. The electrolytic plating composition of claim 1 wherein the nitrogen-containing species comprises at least one amine functional group.

6. The electrolytic plating composition of claim 5 wherein the polyether group is bonded to a nitrogen atom in the at least one amine functional group.

7. The electrolytic plating composition of claim 5 wherein the at least one amine functional group is a quaternary amine.

8. The electrolytic plating composition of claim 2 wherein the nitrogen-containing species comprises at least one amine functional group.

9. The electrolytic plating composition of claim 7 wherein the polyether group is bonded to a nitrogen atom in the at least one amine functional group.

10. The electrolytic plating composition of claim 8 wherein the at least one amine functional group is a quaternary amine.

11. The electrolytic plating composition of claim 1 wherein the nitrogen-containing species comprises between two and five amine functional groups.

12. The electrolytic plating composition of claim 2 wherein the nitrogen-containing species comprises between two and five amine functional groups.

13. The electrolytic plating composition of claim 2 wherein the nitrogen-containing species comprises a diamine.

14. The electrolytic plating composition of claim 2 wherein the nitrogen-containing species is selected from the group consisting of ethylene diamine and triethylene glycol diamine.

15. The electrolytic plating composition of claim 1 wherein the suppressor compound comprises a structure selected from the group consisting of:

$$R_1-\underset{\underset{R_3-R_4}{|}}{\overset{\overset{R_2}{|}}{N}}-R_3-R_4;$$

$$R_1-\underset{\underset{R_3-R_4}{|}}{\overset{\overset{R_2}{|\oplus}}{N}}-R_3-R_4;$$

$$R_1-\underset{\underset{R_3-R_4}{|}}{\overset{\overset{R_3-R_4}{|\oplus}}{N}}-R_3-R_4;$$

and combinations thereof;

wherein $R_1$ is a substituted or unsubstituted alkyl group;

$R_2$ is selected from the group consisting of hydrogen and alkyl group;

$R_3$ is a polyether comprising repeat units selected from the group consisting of ethylene oxide repeat units, propylene oxide repeat units, and a combination thereof; and $R_4$ is selected from the group consisting of hydrogen, substituted or unsubstituted alkyl group, aryl group, aralkyl, or heteroaryl group.

16. The electrolytic plating composition of claim 15 wherein the $R_1$ alkyl group has between 1 and 8 carbons, and $R_1$ is substituted with another amino group to which a polyether group is covalently bonded, the polyether comprising ethylene oxide repeat units, propylene oxide repeat units, or a combination thereof arranged in random, alternating, or block configurations.

17. The electrolytic plating composition of claim 2 wherein the polyether suppressor is present in a concentration between about 50 mg/L and about 200 mg/L.

18. The electrolytic plating composition of claim 1 wherein the polyether suppressor comprises the structure:

$$\begin{array}{c}H-(OC_2H_4)_n-(OC_3H_6)_m\\ \phantom{H-(OC_2H_4)_n}\diagdown\\ \phantom{xxxxxxxxxxxxxxxx}N-\overset{H_2}{C}-\overset{H_2}{C}-N\\ \phantom{H-(OC_2H_4)_n}\diagup\phantom{xxxxxxxxxxxxxxxxxxxx}\diagdown\\ H-(OC_2H_4)_n-(OC_3H_6)_m\phantom{xxxxxxxxxxxx}\end{array}\begin{array}{c}(C_3H_6O)_m-(C_2H_4O)_n-H\\ \\ (C_3H_6O)_m-(C_2H_4O)_n-H,\end{array}$$

wherein n is between 1 and about 30 and m is between 1 and about 30.

19. The electrolytic plating composition of claim 1 wherein the polyether suppressor comprises the structure:

$$\begin{array}{c}H-(OC_2H_4)_n-(OC_3H_6)_m\\ \diagdown\\ \phantom{xxxxxxxxxxxxxx}N-H_2CH_2C-O-CH_2CH_2-O-CH_2CH_2-N\\ \diagup\\ H-(OC_2H_4)_n-(OC_3H_6)_m\end{array}\begin{array}{c}(C_3H_6O)_m-(C_2H_4O)_n-H\\ \\ (C_3H_6O)_m-(C_2H_4O)_n-H,\end{array}$$

wherein n is between 1 and about 30 and m is between 1 and about 30.

* * * * *